United States Patent
Erbe et al.

(10) Patent No.: US 9,400,367 B2
(45) Date of Patent: Jul. 26, 2016

(54) OPTICAL SUBASSEMBLY WITH A MOUNT WITH CONNECTION UNITS OF DIRECTED FLEXIBILITY

(71) Applicant: JENOPTIK Optical Systems GmbH, Jena (DE)

(72) Inventors: Torsten Erbe, Jena (DE); Lutz Reichmann, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 0 days.

(21) Appl. No.: 14/464,189

(22) Filed: Aug. 20, 2014

(65) Prior Publication Data
US 2015/0055233 A1 Feb. 26, 2015

(30) Foreign Application Priority Data
Aug. 23, 2013 (DE) .......... 10 2013 109 185

(51) Int. Cl.
G02B 7/02 (2006.01)
G03F 7/20 (2006.01)
G02B 7/18 (2006.01)
(Continued)

(52) U.S. Cl.
CPC ........... *G02B 7/028* (2013.01); *G02B 7/008* (2013.01); *G02B 7/023* (2013.01); *G02B 7/026* (2013.01); *G02B 7/181* (2013.01); *G03F 7/709* (2013.01); *G02B 7/003* (2013.01); *G02B 7/1827* (2013.01)

(58) Field of Classification Search
CPC ........ G02B 7/003; G02B 7/004; G02B 7/005; G02B 7/008; G02B 7/023; G02B 7/026; G02B 7/028; G02B 7/181; G02B 7/1821; G02B 7/1827; G02B 26/10; G11B 7/0932; G11B 7/0933; G11B 7/0935; G03F 7/70241; G03F 7/70825; G03F 7/709; G03B 13/34; G03B 3/10
USPC ................. 359/811, 813, 814, 819, 820, 822; 369/44.14–44.16
See application file for complete search history.

(56) References Cited

U.S. PATENT DOCUMENTS 6,229,657 B1 * 5/2001 Holderer ................ G02B 7/023
359/819
6,400,516 B1 * 6/2002 Spinali ................ G03F 7/70825
359/818

(Continued)

FOREIGN PATENT DOCUMENTS

CN 102235971 A 11/2011
DE 10 2006 060 088 A1 6/2008
(Continued)

OTHER PUBLICATIONS

Norton, R.L.; Design of Machinery—Hoekens Linkage; 3:134.

*Primary Examiner* — Loha Ben
(74) *Attorney, Agent, or Firm* — Duane Morris LLP (57) ABSTRACT

A thermally compensated optical subassembly having a rotationally symmetrical optical element and a monolithic mount with a rotationally symmetrical mounting ring, having an axis of symmetry, and at least three connection units. The optical element communicates with the mounting ring via the connection units, so as to be secured against tilting and fixed with respect to torsion. The connection units, in each instance, have three couplers which have a determined length ratio with respect to one another and are connected to one another and to the mounting ring and optical element such that defined conditions are met.

3 Claims, 6 Drawing Sheets

(51) Int. Cl.
*G02B 7/00* (2006.01)
*G02B 7/182* (2006.01)

(56) References Cited

U.S. PATENT DOCUMENTS

| | | | | |
|---|---|---|---|---|
| 6,552,862 B2 * | 4/2003 | Dieker | ............. | G02B 7/026 359/819 |
| 6,870,632 B2 * | 3/2005 | Petasch | ............. | G02B 7/023 356/614 |
| 7,139,137 B2 * | 11/2006 | Sudoh | ............. | G02B 7/023 359/811 |
| 7,242,537 B2 * | 7/2007 | Weber | ............. | G02B 7/003 359/223.1 |
| 7,675,566 B2 * | 3/2010 | Tagome | ............. | G02B 7/026 348/357 |
| 7,729,065 B2 * | 6/2010 | Schoeppach | ............. | G02B 7/02 348/340 |
| 7,903,353 B2 * | 3/2011 | Reichmann | ............. | G02B 7/003 359/811 |
| 8,085,482 B2 * | 12/2011 | Frankovich | ............. | G02B 7/004 359/811 |
| 8,134,790 B2 | 3/2012 | Bornschein et al. | | |
| 8,350,959 B2 * | 1/2013 | Topliss | ............. | F03G 7/065 348/208.11 |
| 8,593,568 B2 * | 11/2013 | Topliss | ............. | F03G 7/065 348/202 |
| 2005/0128607 A1 | 6/2005 | Schaffer et al. | | |
| 2009/0101752 A1 | 4/2009 | Mock et al. | | |

FOREIGN PATENT DOCUMENTS

| | | |
|---|---|---|
| DE | 10 2007 014 155 A1 | 9/2008 |
| DE | 10 2010 008 756 A1 | 6/2011 |

* cited by examiner

OPTICAL SUBASSEMBLY WITH A MOUNT WITH CONNECTION UNITS OF DIRECTED FLEXIBILITY

RELATED APPLICATIONS

The present application claims priority benefit of German Application No. DE 10 2013 109 185.7 filed on Aug. 23, 2013, the contents of which are incorporated by reference in its entirety.

FIELD OF THE INVENTION

The invention is directed to an optical subassembly with a monolithic mount and a rotationally symmetrical optical element mounted therein such as is known generically from Patent Application DE 10 2010 008 756 A1.

BACKGROUND OF THE INVENTION

Mounts for optical elements are basically designed depending on the requirements for imaging quality and the given conditions under which the optical system in which the mounted optical element forms a component part is to be transported, stored and used. In particular, anticipated shock loads, possible temperature fluctuations during transport, storage and use and the energy related and spectral influence of radiation during use are factors in this respect. The optical element should be permanently held in position with low strain irrespective of the aforementioned loads.

Based on the above mentioned requirements for a subassembly according to the invention, only those prior art subassemblies or mounts which, like a subassembly according to the invention, hold a rotationally symmetrical optical element in a mount so as to allow radial expansion to be compensated over a given temperature range will be considered hereinafter as component parts of such subassemblies. Subassemblies of this type are referred to as thermally compensated.

Laid Open Application DE 10 2006 060 088 A1 discloses an optical subassembly with a monolithic mount (referred to as a holder in the above-cited reference) in which a rotationally symmetrical optical element is held in a mounting ring by three connection units which are integrated in the mount. The connection units comprise in each instance bending beams (referred to as web) which tangentially contact the optical element. The optical element is held with low strain due to the radial elastic flexibility of the tangentially contacting bending beams, and different thermal expansions between the optical element and mount can be compensated. The optical element is always held so as to be centered. The bending beams contact the circumference of the optical element centrally in each instance and are connected at both ends to the mounting ring. In the basic state of the optical subassembly, the bending beams are substantially relaxed. They are radially tensioned when the optical element expands radially due to a change in temperature. A drawback of this principle of configuring the mount with bending beams tangentially contacting the optical element consists in particular in that external forces acting on the mount which do not act in radial direction on the connection between bending beams and optical element can lead to uncontrolled, irreversible shifting of the optical element, particularly to twisting around the optical axis thereof.

An optical arrangement with a monolithic mount and a rotationally symmetrical optical element which is held therein via three connection units (referred to as spring leg arrangements) is also known from DE 10 2010 008 756 A1. The spring leg arrangements are formed in each instance of two parallel spring legs, one of the ends of both parallel spring legs being connected in each instance via flexure bearings to a mounting ring (referred to as outer mount area), while the other ends open into a contact base at which the optical element is fixed by gluing or soldering. The two parallel spring legs are arranged at a distance from one another in direction of their flexibility, i.e., perpendicular to the optical axis of the optical element, this distance being small in proportion to their length, and extend along a concave curvature line as viewed from the optical element. In case of radial expansion of the optical element, the latter exerts radially acting forces on the contact bases, which leads to the deflection of the parallel spring legs in a perpendicular plane relative to the optical axis. Accordingly, by comparison with the central connection of a bending beam to the optical element according to the above-cited DE 10 2006 060 088 A1, no bending torque would occur in the region of contact with the optical element, for the reason that the spring leg arrangement would itself generate a torque in the contact region that would oppose the torque exerted by the optical element, as a result of which the contact base would only be able to execute a translational movement.

In case of differing expansion of the optical element and mount, there would only be a negligible, slight rotation of the optical element around its optical axis. Since the connection between the spring leg arrangements and the optical element is not loaded, it can advantageously be formed by a bonding connection. This principle of configuring the mount has the drawback that a connection unit designed as a spring leg arrangement of this type occupies a large amount of space so that only three can be arranged.

In both of the mounts mentioned above, the connection units are constructed as spring joints. In a perpendicular plane with respect to the axis of symmetry of the mount, in which plane the optical axis of the optical element extends in case of a centered arrangement of a rotationally symmetrical optical element, these spring joints have only a low spring stiffness so that the optical element can be held with low strain. In view of the desired low spring stiffness of the spring joints in one operative direction, the spring stiffness is also relatively slight in an adjoining area around this operative direction, which can lead in particular to twisting of the spring joints within themselves resulting in a tilting of the optical axis of the optical element with respect to the axis of symmetry of the mount.

It was also noted in both publications that the construction of the mounts as monolithic component parts is merely advantageous, and mounts based on the illustrated principles can also be realized by means of discrete components.

SUMMARY OF THE INVENTION

It is the object of the invention to provide a thermally compensated optical subassembly comprising a mount and a mounted optical element, wherein the optical element is held so as to be preventing from tilting. The optical element should advantageously be designed such that no torque acts on the optical component so that the optical element is also held so as to be fixed with respect to torsion.

In an optical subassembly comprising a rotationally symmetrical optical element and a monolithic mount with a rotationally symmetrical mounting ring, having an axis of symmetry, and at least three connection units via which the optical element communicates with the mounting ring, the above-stated object is met in that the connection units comprise three couplers which are connected to one another, a first coupler having a first length, a second coupler having a second length which is equal to 2.5 times the first length, and a third coupler having a third length which is equal to 5 times the first length. The first coupler is limited in each instance by a third flexure bearing connected to the mounting ring and a first flexure bearing communicating with the third coupler. The second coupler is limited in each instance by a fourth flexure bearing connected to the mounting ring and a second flexure bearing communicating with the third coupler. The third coupler is limited in each instance by the first flexure bearing and a fastening point communicating with the optical element, wherein the second flexure bearing is formed centrally at the third coupler in each instance. The third flexure bearing and fourth flexure bearing are formed at the mounting ring in each instance at a distance from one another equal to two times the first length.

With the simplifying assumption that the couplers are stiff within the range of movement of the connection, the deflection of a connection unit as described above may be represented by a transmission diagram in which the fastening point is guided on a first straight line which extends parallel to a second straight line through the third flexure bearing and fourth flexure bearing.

The third flexure bearing and fourth flexure bearing advantageously lie on a second straight line extending parallel to a first straight line extending through the fastening point and the axis of symmetry radial to the mounting ring so that when there is a deflection of the connection units the fastening points are guided in each instance on one of the first straight lines radially with respect to the axis of symmetry of the mounting ring.

The optical element can advantageously be mounted in an auxiliary mount so that the optical element communicates indirectly with the fastening points via the auxiliary mount.

BRIEF DESCRIPTION OF THE DRAWINGS

The invention will be described more fully in the following with reference to embodiment examples and drawings. The drawings show:

FIG. 3b is a transmission diagram in a position for an undeflected connection unit according to FIG. 3a;

FIG. 4b is a transmission diagram in a position for an undeflected connection unit according to FIG. 4a;

DESCRIPTION OF THE EMBODIMENTS

A subassembly according to the invention has a monolithic mount 1 comprising a mounting ring 2 and at least three connection units 3 comprising couplers and flexure bearings, and an optical element 4 connected to the mount 1.

In principle, a mount 1 according to the invention could also include a mounting ring 2 and connection units 3 formed of discrete couplers and discrete pivot joints by which the couplers are connected to one another and to the mounting ring 2. However, a mount of this type would be far more complicated to produce particularly because of the required assembly steps and would not function as well because of the friction occurring in the joints. Any imaging optical elements such as lenses and mirrors outfitted with a rotationally symmetrical circumferential surface can be considered as optical elements, although this does not limit the possibility of using the mount 1 in connection with filters or optical disks.

All of the embodiment examples of the subassembly have in common that the mount 1 comprises a mounting ring 2 and a quantity of three preferably identical connection units 3 which are preferably arranged equidistant from one another.

The connection units 3 have identical length ratios and identical connections via flexure bearings. Each comprises three couplers (3.1, 3.2, 3.3) assumed to be stiff and can be represented by the same transmission diagram. The individual embodiment examples of the connection units can differ from one another with respect to the angular position of the couplers, which can be represented by different positions of the one transmission diagram. They can also be arranged differently within the mounting ring 2 with the result that the fastening point C is guided on a first straight line $G_1$ in a different position as will be described more fully later.

Figure 3A:
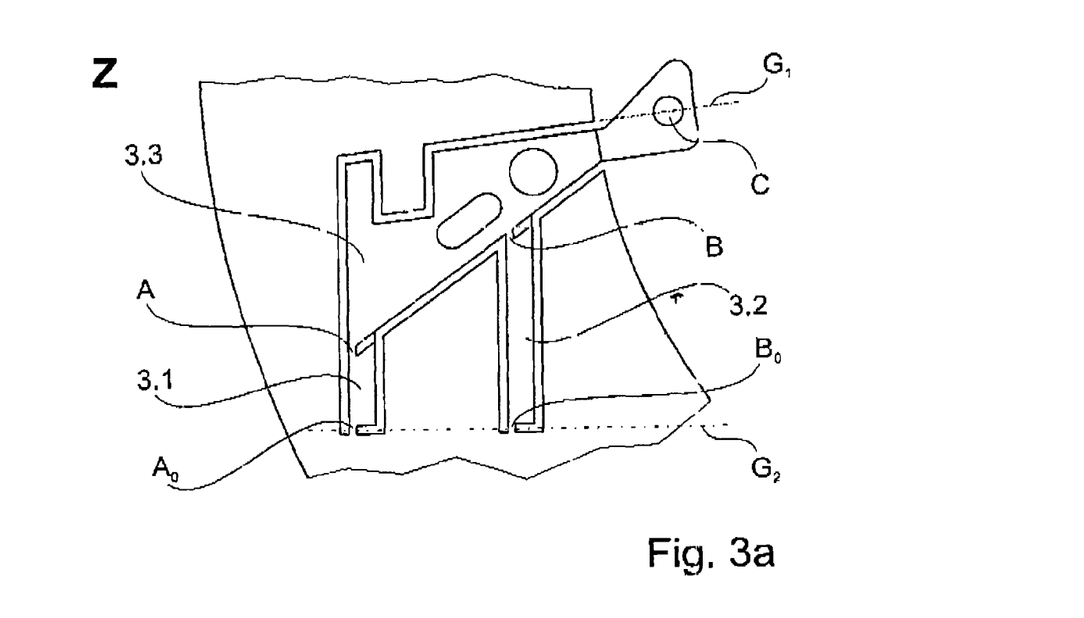
FIG. 3a is an enlarged view of a detail of a connection unit of a mount of an optical subassembly according to FIG. 1.
Figure 3B:
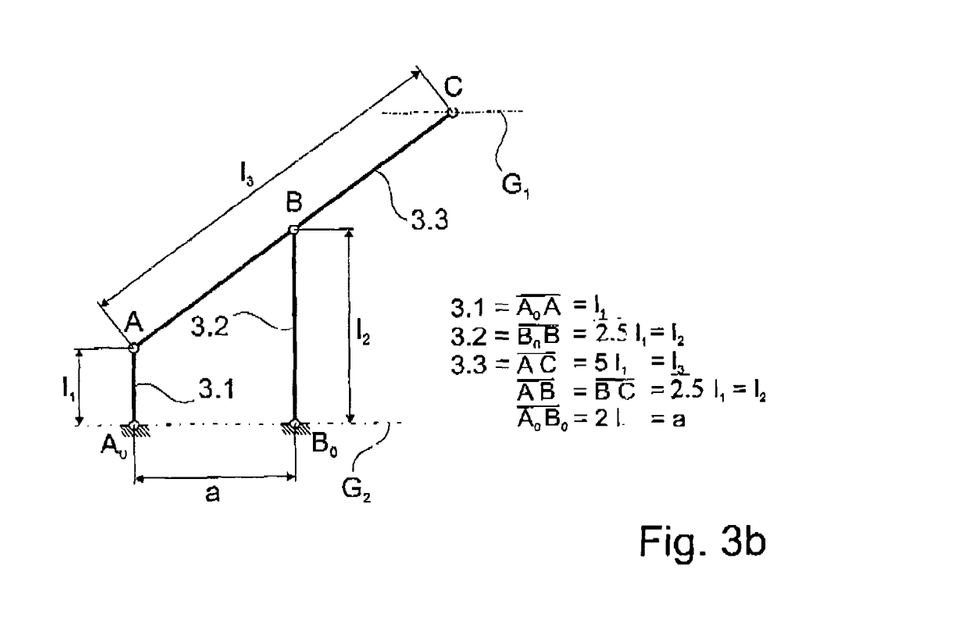
Figure 4A:
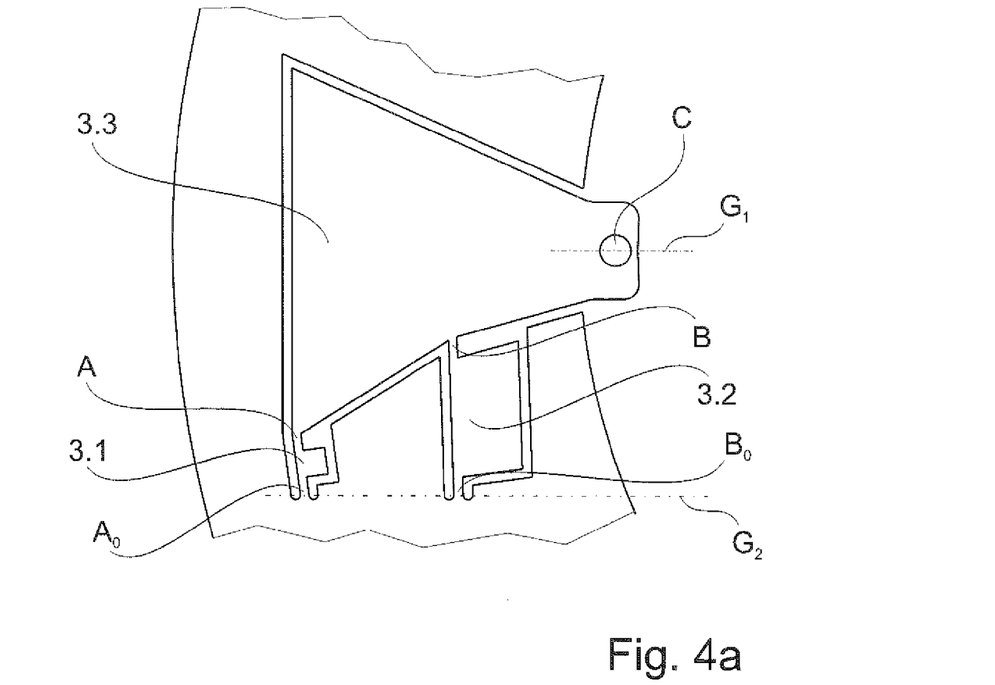
FIG. 4a is an enlarged view of a detail of a connection unit of a mount of an optical subassembly according to a second embodiment example.
Figure 4B:
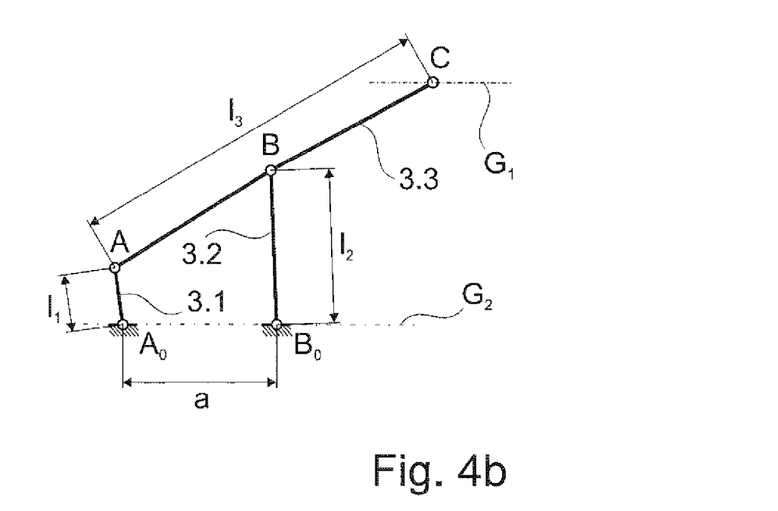
Figure 5:
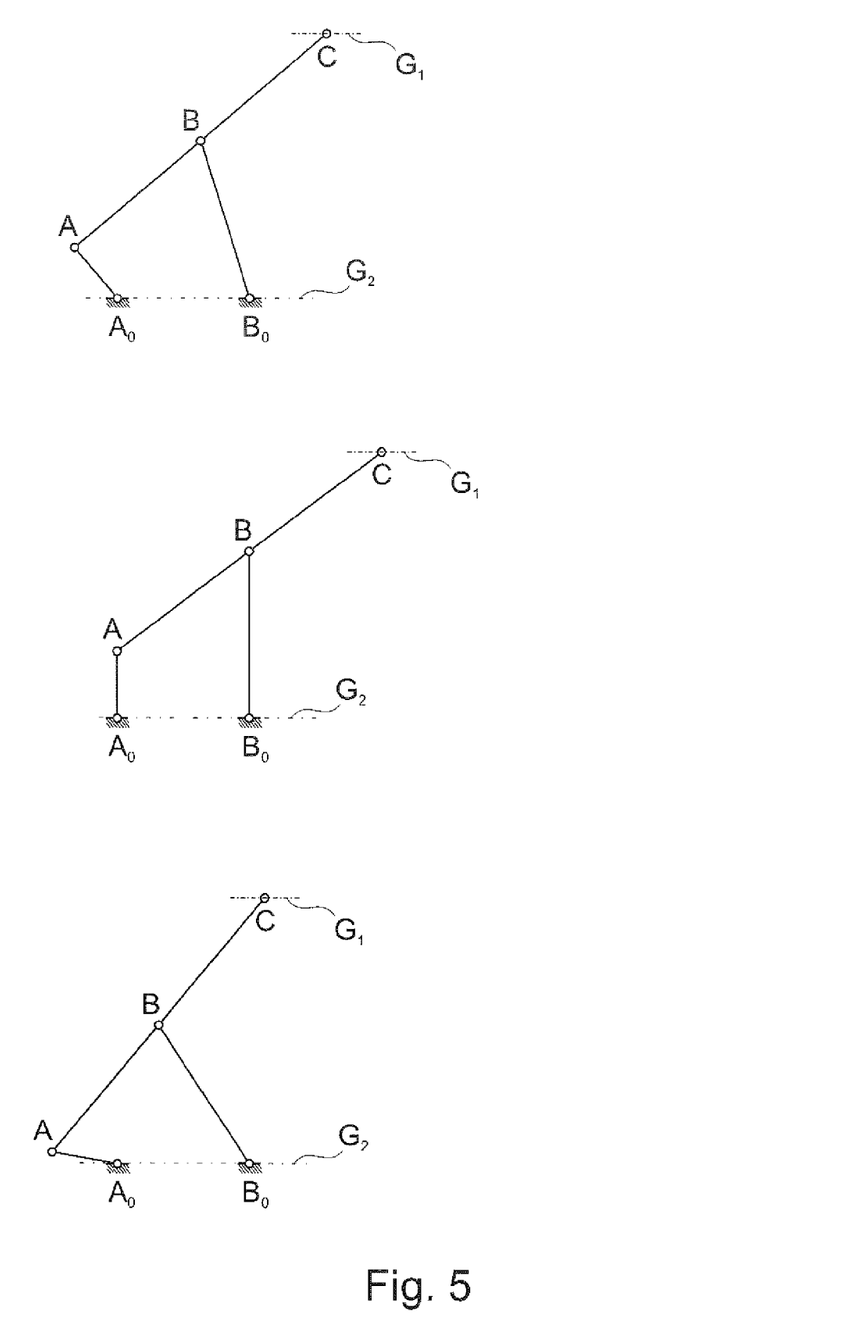
FIG. 5 is a transmission diagrams in further positions for undeflected connection units of further embodiment examples.

The transmission diagram characterizing the connection units 3 which is shown by way of example in different positions in FIGS. 3b, 4b and 5 is dimensioned as follows.

A first coupler 3.1 is limited by a third flexure bearing $A_0$ connected to mounting ring 2 and by a first flexure bearing A communicating with a third coupler 3.3 and has a first length $l_1$. A second coupler 3.2 is limited by a fourth flexure bearing $B_0$ to mounting ring 2 and by a second flexure bearing B communicating centrally with third coupler 3.3 and has a second length $l_2$ which is equal to 2.5 times the first length $l_1$.

The third coupler 3.3 is limited by first flexure bearing A and a fastening point C and has a third length $l_3$ which is equal to 5 times the first length $l_1$. The second flexure bearing B is formed in the middle of third coupler 3.3 which is constructed in a particularly stiff manner.

Adherence to the length ratios mentioned above is a first compulsory condition for the intended function of a connection unit 3 according to the invention which consists in guiding fastening point C on first straight line $G_1$.

Apart from adhering to the above-mentioned length ratios, a second mandatory condition must be met in that the third flexure bearing $A_0$ and fourth flexure bearing $B_0$ must be formed at a distance a from one another at mounting ring 2, which distance is equal to two times the first length $l_1$. The first straight line $G_1$ then extends parallel to an imaginary second straight line $G_2$ which runs through flexure bearings $A_0$, $B_0$. Therefore, the position of the movement path of fastening point C is determined by the arrangement of the third flexure bearing $A_0$ and fourth flexure bearing $B_0$ of a connection unit 3 with respect to the mounting ring 2. Accordingly, in case of expansion of optical element 4, fastening points C of the individual connection units are guided respectively on a first straight line $G_1$ in that the connection units 3 are deflected. In so doing, the couplers are swiveled around the flexure bearings.

In an advantageous manner, first straight line $G_1$ extends radial to axis of symmetry 2.1 of mounting ring 2 and, therefore, radial to an optical element 4 which has a rotationally symmetrical circumferential surface and is mounted via fastening points C. A displacement of fastening points C, which is only possible along first straight line $G_1$, then leads to a guided, exclusively translational, axially symmetrical movement of the fastening points C toward or away from the axis of symmetry 2.1 of mounting ring 2.

A connection unit 3 basically differs substantially from connection units 3 known from the prior art in that they do not have bending beams but is rather a coupling mechanism, also known as coupler transmission, which causes a guided, preferably radially guided, compensating movement of fastening point C.

It was assumed in the foregoing description that the couplers are sufficiently stiff that the movement path of fastening point C can be described by a transmission diagram of a coupler transmission. However, since the couplers are only approximately sufficiently stiff in practice because of the monolithic construction, fastening point C on its movement path does not actually describe an ideal first straight line $G_1$ extending parallel to a second straight line $G_2$. Insofar as the deviations are not insignificant, they can at least be considerably reduced in that the third flexure bearing $A_0$ and the fourth flexure bearing $B_0$ are offset slightly so that the imaginary second straight line $G_2$ through them extends only approximately parallel to the first straight line $G_1$. Considering the subassembly in theory, the deviations caused by a bending of the couplers, which cannot be completely ruled out, are not taken into account.

As regards the effect of mechanical and thermal influences, the subassembly has the following advantages in particular:

In the event of changes in temperature leading to an unequal expansion of optical element 4 and mount 1, the relative movement between optical element 4 and mount 1 is a purely translational movement of fastening point C along the first straight line $G_1$ which may also extend radially. Therefore, optical element 4 does not undergo any torque, which is important for preserving the imaging quality of optical element 4 and for preserving a low-strain centric position and mechanical stability of the connection of optical element 4 to connection units 3 via fastening points C.

Mechanical deformations of mount 1 which can occur when the mount 1 is adjusted e.g. via holding elements in a housing part by means of manipulators are absorbed by the third flexure bearing $A_0$ and fourth flexure bearing $B_0$, respectively, and are not transmitted to fastening points C.

Also, shock loads acting on mount 1 from the outside insofar as they act locally on mount 1 are either not transmitted to optical element 4 or, if so, at most through a temporary translational displacement of fastening points C. The resonant frequency of connection units 3 is low compared to connection units 3 with bending beams known from the art, so that only small oscillation amplitudes can occur under loads.

Because of the above-mentioned construction of the connection units 3, the optical element 4 is loaded only by its weight force and the opposing holding forces and symmetrically by exclusively radially acting compensating forces which do not influence the position of optical element 4 in mount 1 and are nominally equal to zero.

The third flexure bearing $A_0$ and fourth flexure bearing $B_0$ can also be arranged with respect to mounting ring 2 such that first straight line $G_1$ does not extend radially. Insofar as a possible twisting of optical element 4 can be tolerated or a temperature range to be compensated is so small that a possible twisting can be disregarded, this need not result in a more inferior construction of the optical subassembly.

The stiffness of the connection units 3 in axial direction is very high compared to the connection units 3 comprising spring joints, so that at the maximum anticipated forces there is no twisting of the connection units 3 that can lead to a tilting of optical element 4.

The stiffness can be increased even more with an increasingly greater number of connection units 3. To this end it is advantageous that connection units 3 can be constructed so as to be relatively small. Accordingly, more than three, e.g., six, connection units 3 or even more can be formed. Regardless of quantity, connection units 3 are advantageously identical and are constructed at an identical angular distance relative to one another. It could be useful to form the connection units 3 disparately or to arrange them at an irregular angular spacing relative to one another if an optically active surface of optical element 4 is not rotationally symmetrical but rather has a freeform surface, for example.

A quantity increasingly greater than three, particularly six, also results in an advantageous transmission of force distributed along the circumference of optical element 4 and a stiffer connection of the optical element to the mount, particularly in case of external mechanical influences on the mount 1. This reduces the risk of stressing of the optical element 4 with a greater quantity of connection units 3. The couplers 3.1, 3.2 and 3.3 which are only relatively short and stiff lead to a desirable high axial stiffness of the mount 1.

During production of monolithic mounts, cuts are introduced into a mount body by different techniques so that the mount body is divided into mounting ring and connection units. The position and dimension of the couplers and flexure bearings formed in this way are determined by the cutting so that it is possible in a simple manner particularly to determine the thickness of the couplers in a perpendicular plane with respect to the axis of symmetry and, therefore, to determine the stiffness of the couplers and the stiffness of the flexure bearings in this plane by means of the cutting.

Two embodiment examples of the connection units are described in more detail in the following.

Figure 1:
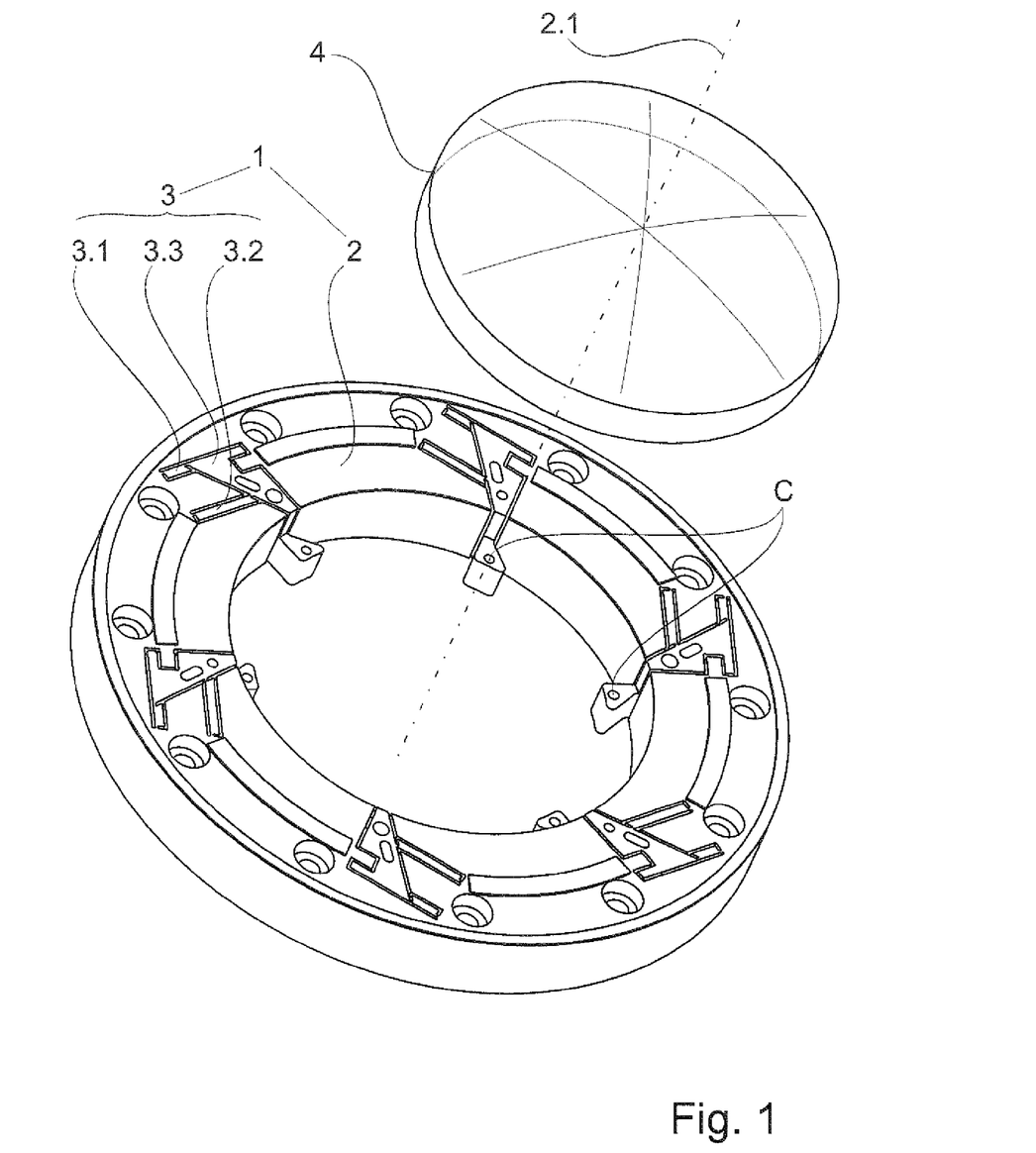
FIG. 1 is an exploded view of a first embodiment example of an optical subassembly.
Figure 2:
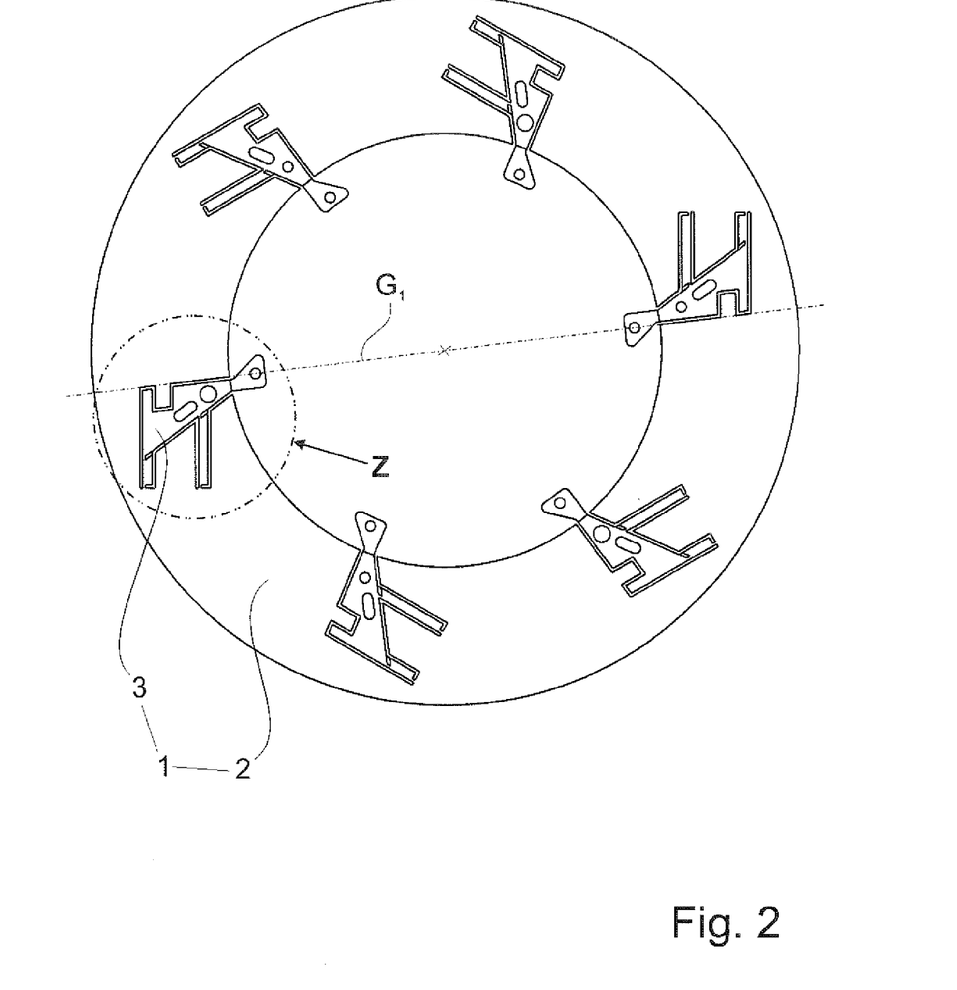
FIG. 2 is a top view of a mount of an optical subassembly according to FIG. 1 restricted to the essential features.

FIGS. 1 and 2 shows a concrete construction of a first embodiment example of a mount 1 according to the invention comprising a mounting ring 2 with six connection units 3. An enlarged detail of the mount 1 with a connection unit 3 is shown in FIG. 3a.

FIG. 4a shows a detail of a concrete construction of a second embodiment example of a mount 1 according to the invention comprising mounting ring 2 with four connection units 3.

In both embodiment examples, the first coupler 3.1 and second coupler 3.2 of the connection units 3 are advantageously arranged parallel to one another, which makes it easier to verify the lengths for example. The connection units of the embodiment examples differ with respect to the angle formed by couplers 3.1, 3.2 with third coupler 3.3 and with respect to the stiffness of couplers 3.1, 3.2, 3.3 in that those of the second embodiment example are constructed on a larger scale. Further, the second embodiment example has a smaller radial dimension so that the mount can be constructed with a smaller outer diameter if it is assumed that the area of the mount that is not weakened by slits should have a minimum width.

According to the second embodiment example, the third coupler has a larger surface area, which may be more advantageous for arranging fastening elements, e.g., a clamping brackets for fixing optical element 4. Elements arranged at third coupler 3.3 do not change position relative to optical element 4. Further embodiment examples such as can be described, e.g., by the positions of the transmission diagram shown in FIG. 5 have a first coupler 3.1 and second coupler 3.2 which do not extend parallel to one another.

As is clearly illustrated in FIG. 1, fastening points C are formed as support blocks extending in the otherwise free inner diameter of mounting ring 2. Optical element 4 lies on these support blocks and is connected to the support blocks preferably by a bonding engagement. However, it can also be fixed via an indirect positively engaging or positively and frictionally engaging connection such as a screw connection.

FIG. 1 also shows elongated raised portions which are distributed on a circular line and which serve as contact faces for a mount arranged adjacently in an optical system. There is sufficient space available for this purpose owing to the small installation space occupied by the connection units. Also, there remains sufficient space to provide, e.g., through-holes in the edge region of the mounting ring 2 as is also shown in FIG. 1, through which the mount 1 can be mounted, e.g., at a housing part. These through-holes which are not a feature of the mount 1 essential to the invention are not shown in FIG. 2 for the sake of clarity.

Figure 6:
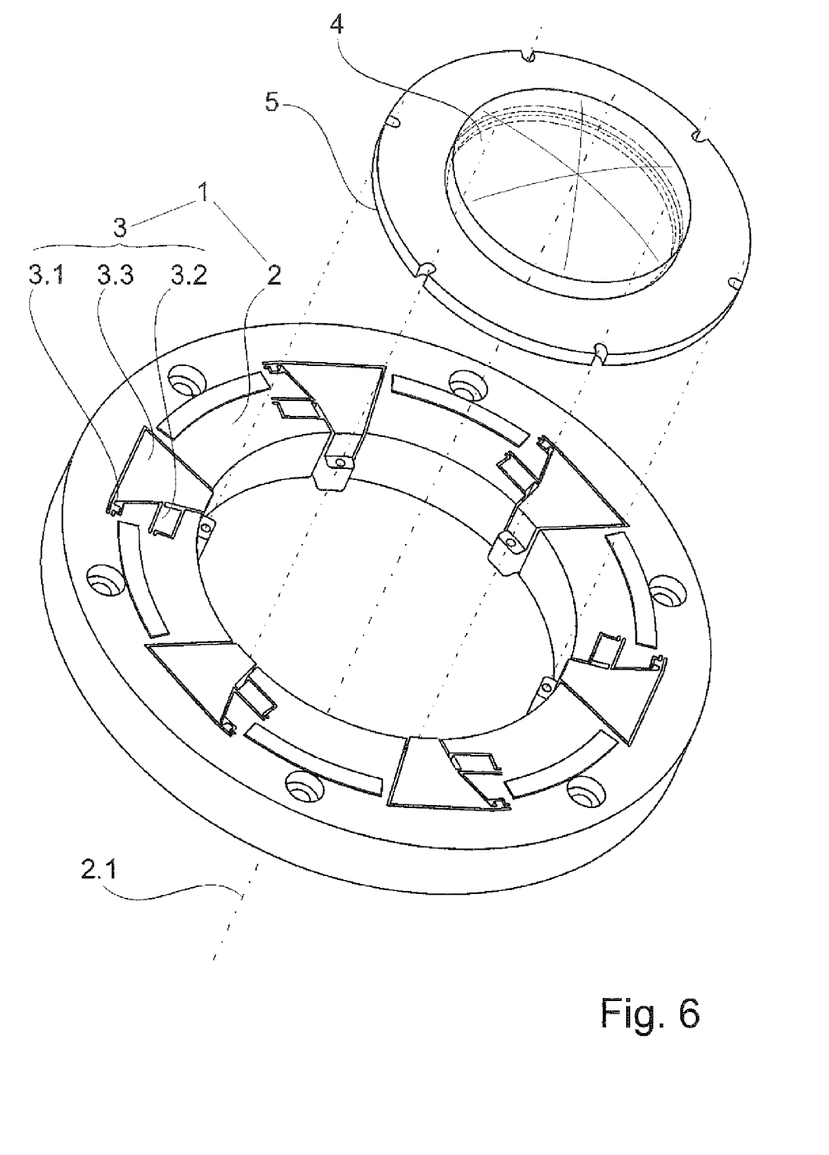
FIG. 6 is a perspective view of the first embodiment example of an optical subassembly.

Optical element 4 can be connected to the connection units 3 directly or indirectly by means of an auxiliary mount 5 as is shown in FIG. 6. Particularly when optical element 4 itself does not have a rotationally symmetrical circumference or adjacently arranged elements have an appreciably larger outer diameter, it can be held in a rotationally symmetrical auxiliary mount 5 which is then connected in turn to the connection units 3 of the mount 1.

Optical element 4, or the optical element 4 held in an auxiliary mount 5, can be connected to connection unit 3 by a bonding engagement, e.g., by gluing or soldering, or positively engaging or frictionally engaging fastenings (e.g., pins, rivets, screws or other elements). In this respect, it is advantageous when the connection is located in, or at least in the immediate vicinity of, fastening point C, e.g., by means of a threaded bore at this location.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE NUMERALS

1 mount
2 mounting ring
2.1 axis of symmetry
3 connection unit
3.1 first coupler
3.2 second coupler
3.3 third coupler
4 optical element
5 auxiliary mount
A first flexure bearing
B second flexure bearing
$A_0$ third flexure bearing
$B_0$ fourth flexure bearing
C fastening point
$l_1$ first length
$l_2$ second length
$l_3$ third length
$G_1$ first straight line
$G_2$ second straight line
a distance

What is claimed is:

1. Optical subassembly comprising a rotationally symmetrical optical element and a monolithic mount with a rotationally symmetrical mounting ring, having an axis of symmetry, and at least three connection units via which the optical element communicates with the mounting ring, said connection units being formed in each instance of a first coupler with a first length, a second coupler with a second length which is equal to two and one half times the first length, and a third coupler with a third length which is equal to five times the first length, wherein the first coupler is limited in each instance by a third flexure bearing connected to the mounting ring and by a first flexure bearing communicating with the third coupler, the second coupler being limited in each instance by a fourth flexure bearing connected to the mounting ring and by a second flexure bearing communicating with the third coupler, the third coupler being limited in each instance by the first flexure bearing and by a fastening point communicating with the optical element, wherein the second flexure bearing is formed centrally at the third coupler in each instance, and said third flexure bearing and fourth flexure bearing being formed at the mounting ring in each instance at a distance from one another equal to two times the first length.

2. Optical subassembly according to claim 1, wherein the third flexure bearing and fourth flexure bearing lie in each instance on a second straight line which extends parallel to a first straight line extending respectively through the fastening point and the axis of symmetry radial to the mounting ring so that when there is a deflection of the connection units the fastening points are guided in each instance on one of the first straight lines radially with respect to the axis of symmetry of the mounting ring.

3. Optical subassembly according to claim 1, wherein the optical element is mounted in an auxiliary mount so that the optical element communicates indirectly with the fastening point via the auxiliary mount.

* * * * *